(12) United States Patent
Willer

(10) Patent No.: US 7,034,336 B2
(45) Date of Patent: Apr. 25, 2006

(54) CAPACITORLESS 1-TRANSISTOR DRAM CELL AND FABRICATION METHOD

(75) Inventor: Josef Willer, Riemerling (DE)

(73) Assignees: Infineon Technologies AG, Munich (DE); Infineon Technologies Flash GmbH & Co. KG, Dresden (DE)

( * ) Notice: Subject to any disclaimer, the term of this patent is extended or adjusted under 35 U.S.C. 154(b) by 0 days.

(21) Appl. No.: 10/911,994

(22) Filed: Aug. 5, 2004

(65) Prior Publication Data

US 2005/0064659 A1 Mar. 24, 2005

Related U.S. Application Data

(63) Continuation of application No. PCT/DE03/00181, filed on Jan. 23, 2003.

(30) Foreign Application Priority Data

Feb. 6, 2002 (DE) ................................ 102 04 871

(51) Int. Cl.
*H01L 27/108* (2006.01)
(52) U.S. Cl. .............................. 257/60; 257/61; 257/62; 257/68; 257/69; 257/70; 257/71; 257/296; 257/329; 257/906
(58) Field of Classification Search ............ 257/60–62, 257/68–71, 296, 329, 906
See application file for complete search history.

(56) References Cited

U.S. PATENT DOCUMENTS

| 5,497,017 | A | 3/1996 | Gonzales |
| 5,744,386 | A | 4/1998 | Kenney |
| 6,111,778 | A | 8/2000 | MacDonald et al. |
| 6,521,935 | B1 | 2/2003 | Krautschneider et al. |
| 6,750,095 | B1 | 6/2004 | Bertagnoll et al. |

FOREIGN PATENT DOCUMENTS

| DE | 199 29 211 A1 | 1/2001 |
| WO | WO 00/19529 A1 | 4/2000 |

OTHER PUBLICATIONS

Wann, H., et al., "A Capacitorless DRAM Cell on SOI Substrate," 1993 IEEE, pp. 635-638.
Okhonin, S., et al., "A SOI Capacitor-less 1T-DRAM Concept," 2001 IEEE International SOI Conference.

*Primary Examiner*—George Fourson
*Assistant Examiner*—Thanh V. Pham
(74) *Attorney, Agent, or Firm*—Slater & Matsil, L.L.P.

(57) ABSTRACT

The channel region (11) and the source-drain regions (9, 10) are arranged vertically at a sidewall of a dielectric trench filling (4). On the opposite side, the semiconductor material is bounded by the gate dielectric (18) and the gate electrode (16), which is arranged in a cutout of the semiconductor material. A memory cell array comprises a multiplicity of vertically oriented strip-type semiconductor regions in which source-drain regions are implanted at the top and bottom and a channel region embedded in insulating material on all sides is present in between as a floating body.

6 Claims, 5 Drawing Sheets

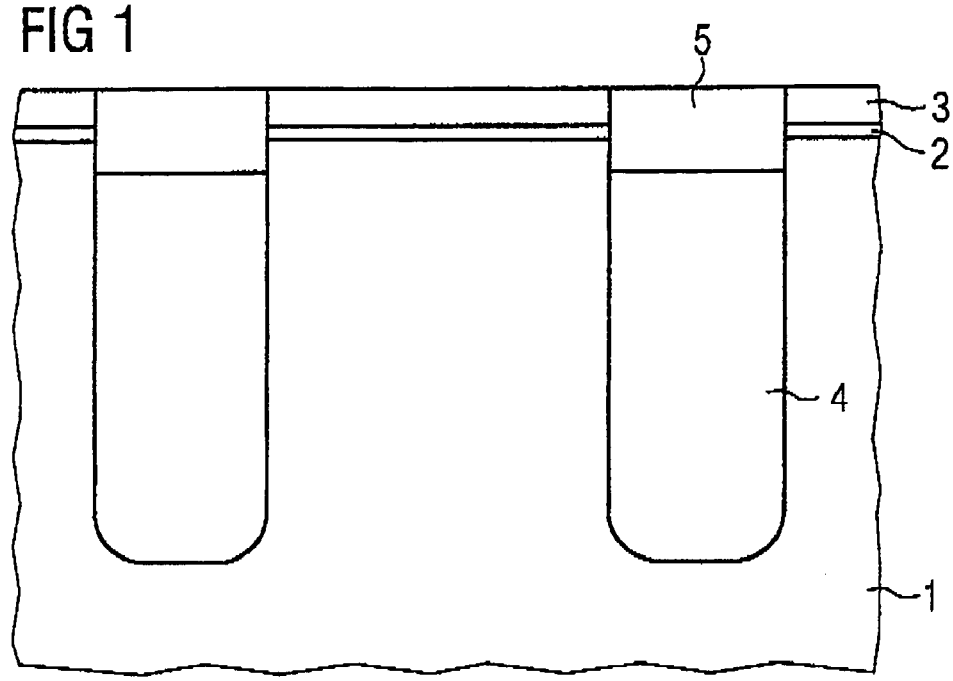
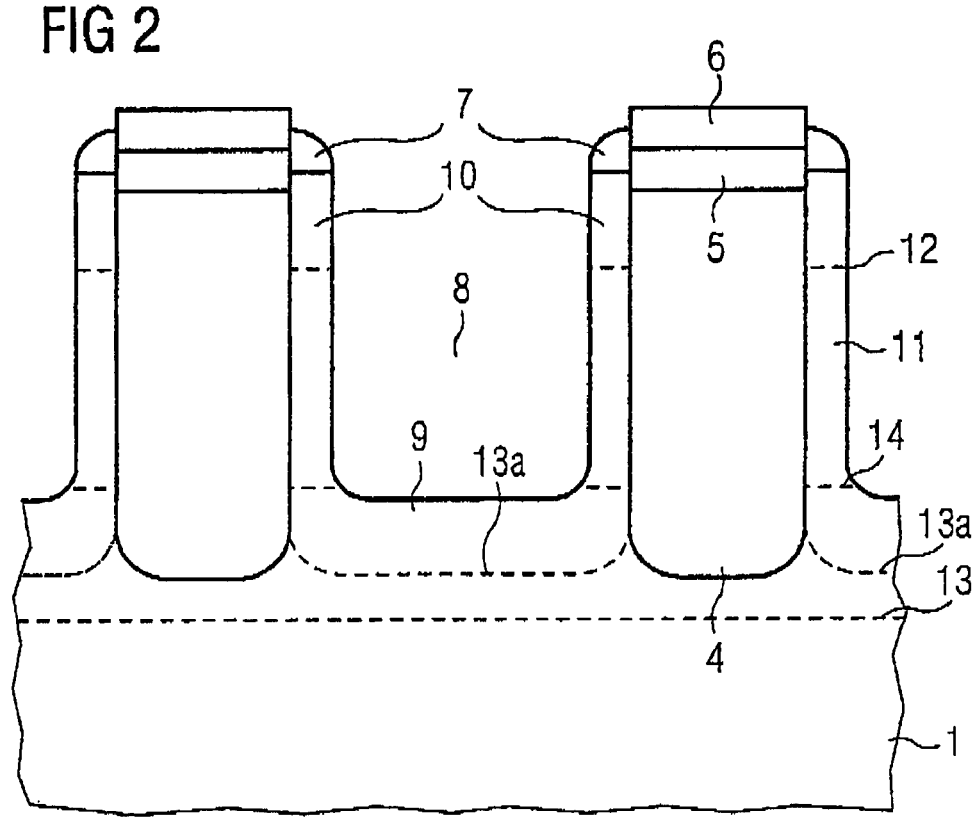

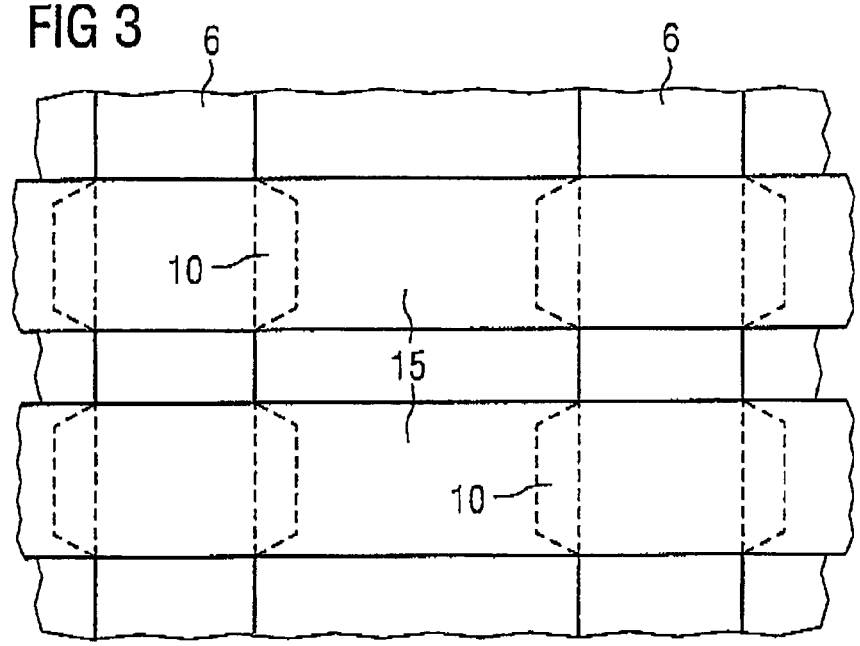
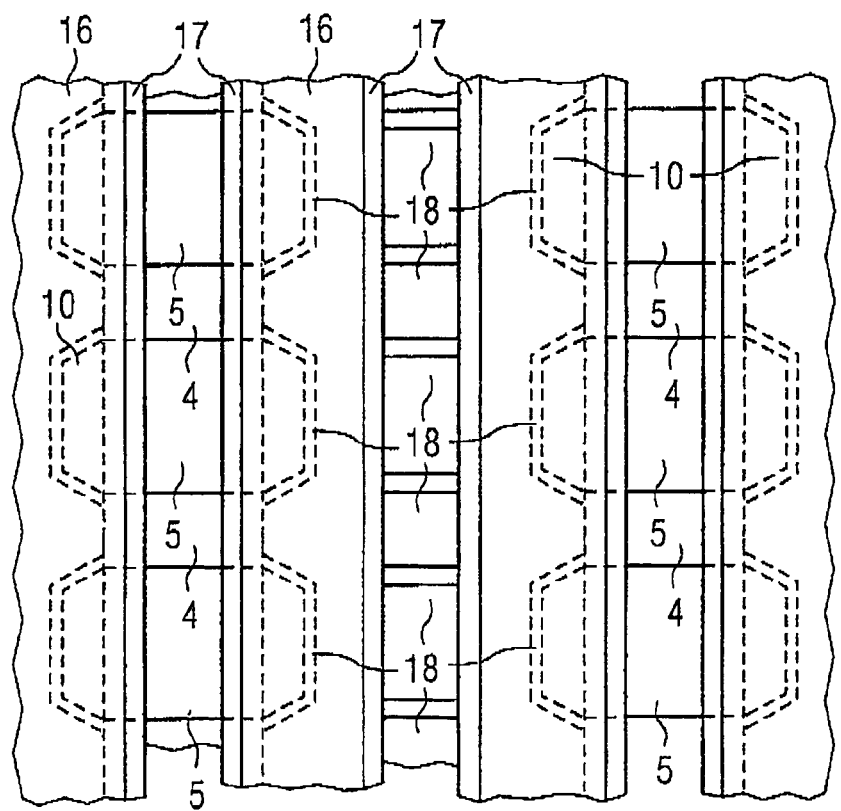

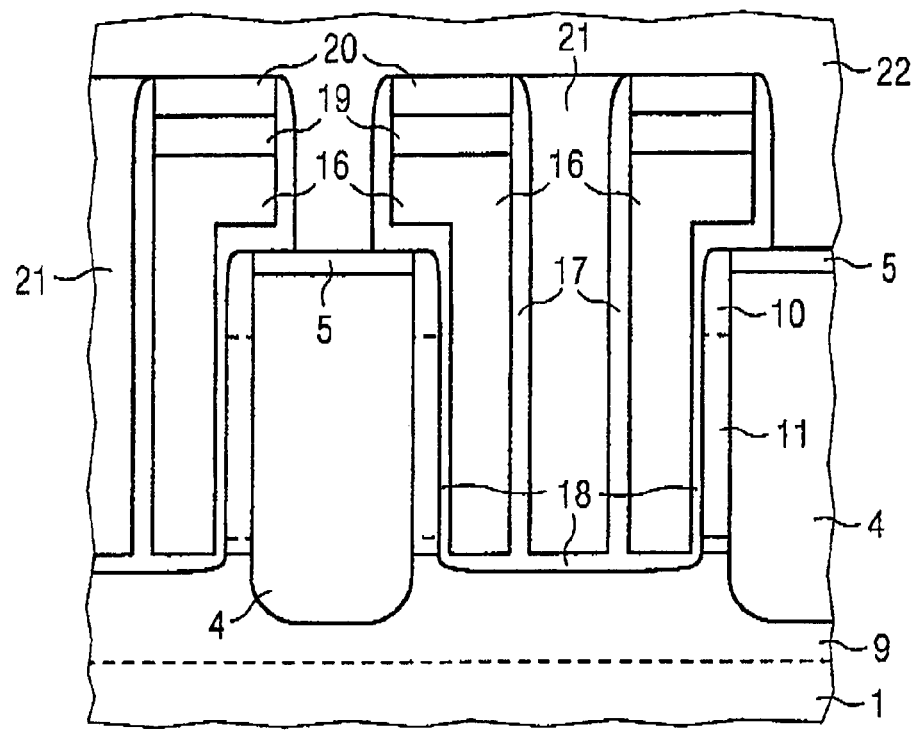
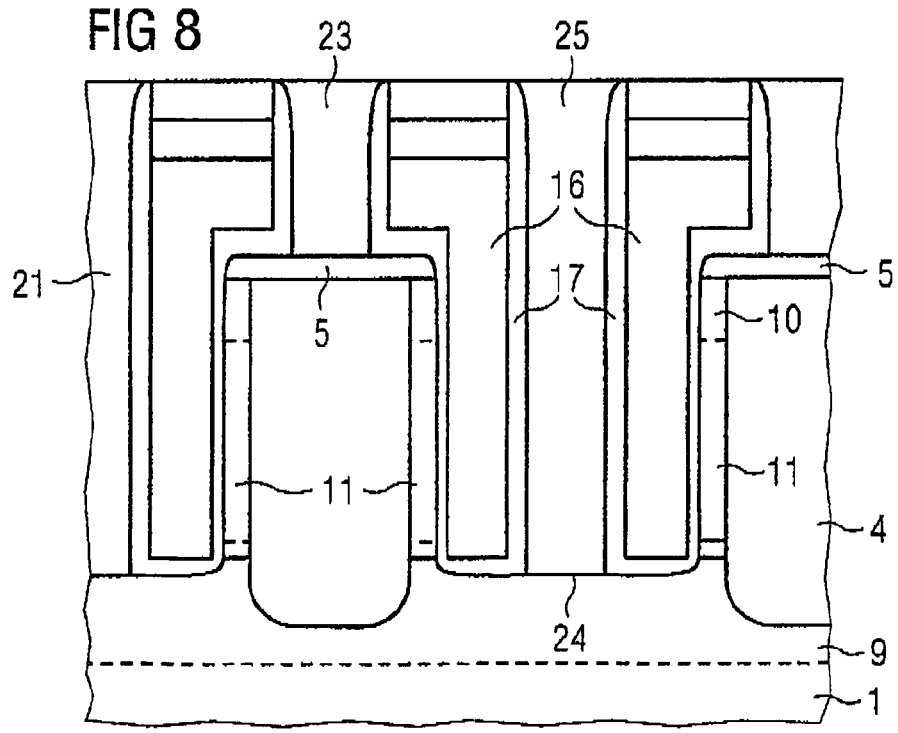

CAPACITORLESS 1-TRANSISTOR DRAM CELL AND FABRICATION METHOD

This application is a continuation of PCT application PCT/DE03/00181, filed on Jan. 23, 2003 and published in German on Aug. 14, 2003, which application claims priority to German patent application 102 04 871.1, filed Feb. 6, 2002. Both of these applications are incorporated herein by reference.

TECHNICAL FIELD

The present invention relates to a capacitorless 1-transistor DRAM cell, simply referred to as 1-transistor DRAM cell hereinafter, and an associated fabrication method.

BACKGROUND

S. Okhonin, M. Nagoga, J. M. Sallese and P. Fazan from the Ecole Polytechnique Fédérale de Lausanne (Preprint and Presentation at the IEEE SOI Conference, ISS/EPFL 2001) have proposed an embodiment of DRAM cells in the sub-100 nm range in which the memory cell is arranged as transistor structure in the body silicon layer of an SOI substrate. This concept dispenses with a formation of a capacitor that is specially provided for each cell. The semiconductor material which comprises the source region, the channel region and the drain region is in this case enclosed on all sides by $SiO_2$ as electrically insulating material. A channel region that is not connected to a defined potential is thus present, which channel region, during operation of the cell, forms a zone that is fully or at least partially depleted of charge carriers (partially to fully depleted floating body). A gate electrode isolated from the channel region by a gate dielectric is situated on the top side.

The MOS transistor structure formed in this way is suitable for storing the charge which represents one bit. Disadvantages of this embodiment are the use of a comparatively expensive SOI substrate and the necessary compromise between a small space requirement sought for the cell and the gate length that can be realized.

SUMMARY OF THE INVENTION

In one aspect, the present invention specifies a space-saving 1-transistor DRAM cell that can be fabricated in a cost-effective manner and can be used to fabricate a memory cell array.

In the case of the (capacitorless) 1-transistor DRAM cell, the channel region and the source-drain regions are arranged vertically at a sidewall of a dielectric trench filling. On the side opposite to the trench filling, the semiconductor material is bounded by the gate dielectric and the gate electrode arranged above the latter. The gate electrode is arranged in a cutout of the semiconductor material.

A memory cell array comprising 1-transistor DRAM cells of this type comprises, in a semiconductor chip, a multiplicity of vertically oriented strip-type semiconductor regions in which source-drain regions are in each case implanted in an upper and lower portion and a channel region that is not connected to a defined potential is present in the central region in between, which channel region is embedded in insulating material on all sides in a sectional plane that is co-planar with respect to the plane of the top side of the semiconductor chip. In this case, the plane of the top side of the semiconductor chip is to be understood as a plane which is co-planar with respect to a top side of a wafer used during the fabrication, which top side is provided with the cells and is at least originally planar, or with respect to the planes of a grown layer structure or applied passivation.

BRIEF DESCRIPTION OF THE DRAWINGS

Examples of the 1-transistor DRAM cell and preferred fabrication methods are described in more detail below with reference to FIGS. 1 to 9.

FIGS. 1, 2, 5, 6 and 7 show cross-sections through intermediate products of a fabrication method;

FIGS. 3 and 4 show plan views of the memory cell array after different steps of the fabrication method;

FIG. 8 shows a cross-section through an intermediate product of an alternative fabrication method.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 9:
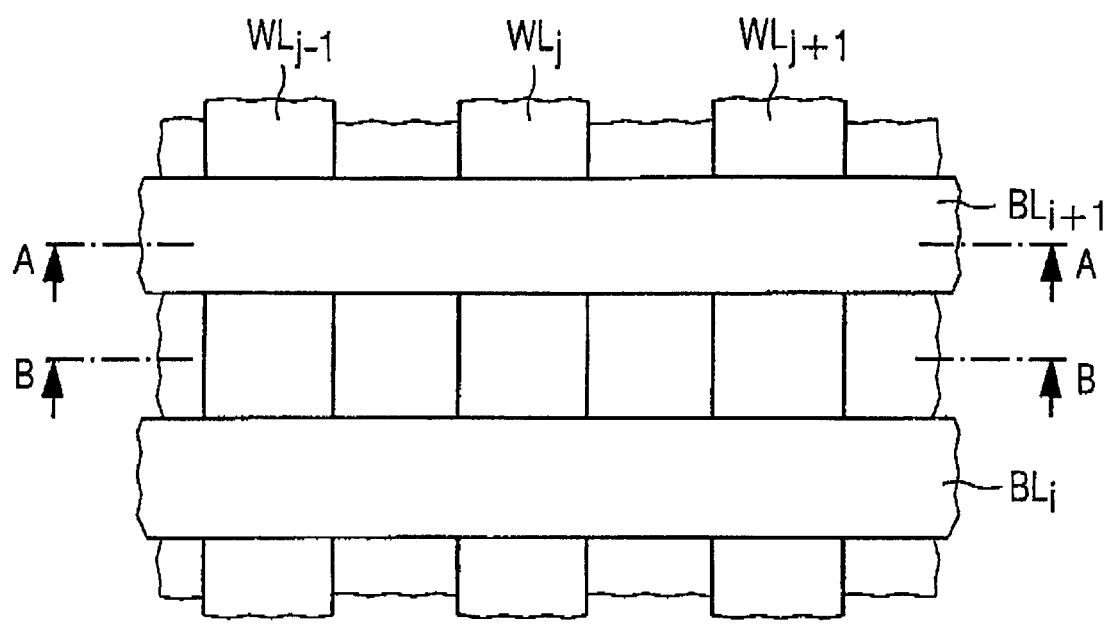
FIG. 9 shows an arrangement of the word lines and bit lines of a memory cell array in plan view.

The orientation of the word lines $WL_{j-1}$, $WL_j$, $WL_{j+1}$, and of the bit lines $BL_i$, $BL_{i+1}$, which are routed such that they run transversely above the word lines, is illustrated in a diagrammatic plan view of a memory cell array in FIG. 9. Broken lines additionally depict the positions of two cross-sections A and B; these positions correspond to the positions of the cross-sections of FIGS. 5 and 6, which will be explained below. A crosspoint DRAM architecture in accordance with the illustration of FIG. 9 manages with an area requirement of $4F^2$ per cell.

The structure of the cells is explained below with reference to preferred fabrication methods. The fabrication process preferably begins with method steps, which are known per se from semiconductor technology. In accordance with the cross-section illustrated in FIG. 1, firstly a layer as pad oxide 2 and a layer as pad nitride 3 are applied in the customary manner on a semiconductor body 1 or a substrate. Trenches oriented parallel to one another are then fabricated in the manner of an STI (shallow trench isolation) by means of a suitable photomask technique. To that end, the semiconductor material is etched out in the region of the mask openings.

The trenches are filled with an oxide or another dielectric material 4. If appropriate, there follow suitable measures for planarization, such as e.g., CMP (chemical mechanical polishing). The p-type wells and n-type wells for CMOS components of the driving periphery are preferably also fabricated. That can be done in the customary manner by means of boron and phosphorus implantation, respectively, and annealing of the implants.

The dielectric material 4 in the trenches is removed in the upper region of the trenches, so that an electrically conductive layer 5 can in each case be introduced there up to the upper edge of the trenches. These electrically conductive layers 5, which in each case run in strip form in the trenches, are in contact laterally with the semiconductor material of the semiconductor body 1 or substrate. It is expedient for the subsequent method steps if polysilicon is used for the electrically conductive layers 5 and this polysilicon is oxidized somewhat at the top side of the layers, the volume of the relevant layer portion 6 increasing. An oxide mask is formed in this way. The nitride of the pad nitride layer 3 is then removed. The etching attack can be protected in part by means of a photomask technique, which is beneficial particularly in the region of the driving periphery.

Spacer elements (spacers) of a mask for a self-aligned patterning of the active trenches that are subsequently to be fabricated are fabricated preferably by means of a renewed deposition of nitride or TEOS. The active trenches are provided on the one hand for delimiting the semiconductor material at the sidewalls of the trench fillings made of dielectric material 4 and on the other hand for accommodating the gate electrodes used for the driving of the channel regions.

For the upper source-drain regions with regard to the semiconductor body or substrate, firstly an $n^+$-type implantation is introduced (e.g., by means of arsenic). If appropriate, an LDD (lightly doped drain) may additionally be fabricated by an implantation of phosphorus.

The structure is thus produced in accordance with the illustration in FIG. 2, in the case of which structure the semiconductor material has remained below the spacer elements 7 and the cutout 8 is present between these portions of the semiconductor material at the sidewalls of two opposite trench fillings. The upper source-drain regions 10 are formed in the respective upper portions by the implantation. Corresponding implantations for the lower source-drain regions 9 are then additionally introduced.

The lower boundary 12 of the upper source-drain regions 10 and the lower boundary 13 of the lower source-drain regions 9 are depicted by broken lines. The lower boundary 13 of the implantation introduced for the lower source-drain regions 9 is preferably present at a depth such that a continuous lower source-drain region 9 is formed in the manner of a ground plate. However, it may also suffice to introduce the relevant implantation only about as far as the broken line 13a depicted as an alternative. The upper boundary 14 of the lower source-drain region 9 and the lower boundary 12 of the upper source-drain region 10 enclose the respective channel region 11. During the fabrication of the lower doped regions 9, the channel region 11 is covered e.g., by prior deposition of a suitably patterned nitride layer at the walls of the cutout 8 and is thus protected against a penetration of the dopant. The lateral portions of the lower source-drain region 9 arise as a result of a diffusion of the introduced dopant during the annealing of the implants.

In accordance with the diagrammatic plan view illustrated in FIG. 3, strip-type photoresist masks 15 are then applied to the top side in order firstly to remove the insulating material present on the top side, in particular the layer portion 6 fabricated preferably by oxidation of polysilicon, and then to remove the electrically conductive layer 5 and the semiconductor material of the semiconductor body 1 in the regions between the strips of the photoresist mask. In FIG. 3, the lateral boundaries of the upper source-drain regions 10 are additionally depicted by broken lines as concealed contours.

FIG. 4 illustrates the plan view in accordance with FIG. 3 after the strip-type mask of the layer portion 6. The mask being fabricated from oxidized polysilicon or else a different material, has been removed in this region and the walls of the now enlarged cutouts 8 between the trench fillings and also the surface of the semiconductor material at the sidewalls of the trench fillings, have been coated with a thin dielectric layer 18, preferably an oxide layer. The dielectric layer 18 is provided as gate dielectric on the semiconductor material at the sidewalls of the trench fillings.

The gate electrodes 16 are fabricated in the cutouts, to be precise in such a way that they partially overlap a trench filling. The gate electrodes 16 are covered with insulating spacer elements 17 on both sides with regard to their longitudinal directions. The electrically conductive layers 5 are removed in the region between the strips of the photoresist mask 15 so that there is a conductive connection between the regions of the individual cells only in the bottom region of the trenches.

Figure 5:
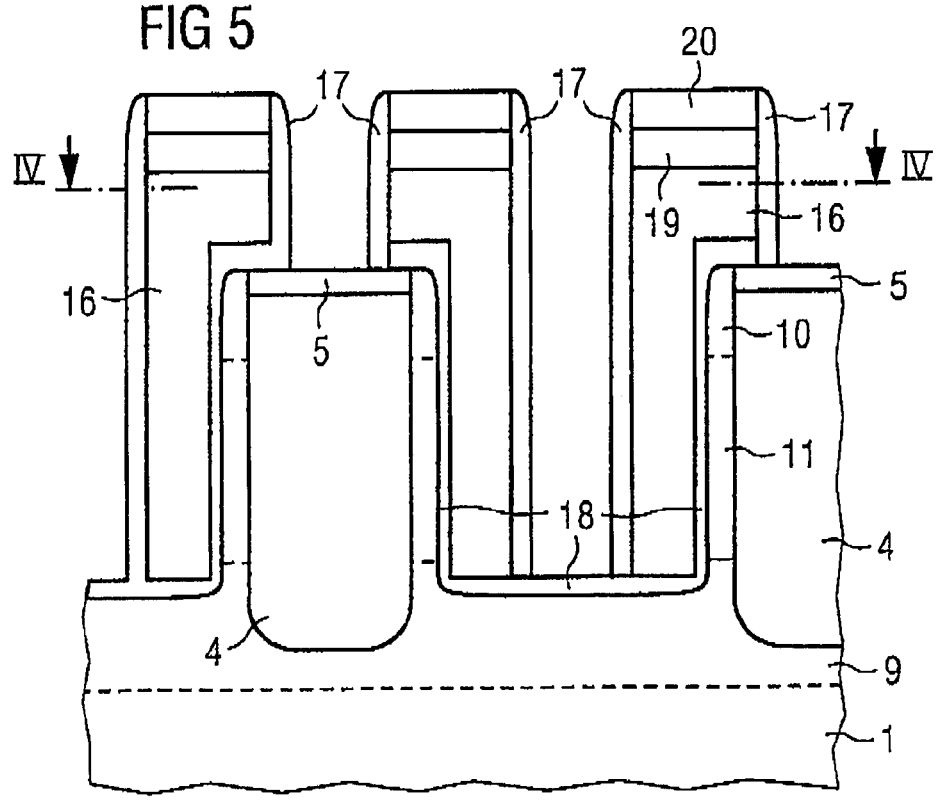

FIG. 5 illustrates this structure in a cross-section, which occupies the position of the cross-section A in FIG. 9, although FIG. 5 only shows an intermediate product in the case of which the bit lines have not yet been fabricated. In this case, portions of the electrically conductive layers 5, which are in each case delimited on all sides to individual cells, are situated on the top sides of the trench fillings made of dielectric material 4. It can also be seen here that the two gate electrodes 16, which are provided for the channel regions 11 arranged at two mutually opposite sidewalls of the dielectric material 4, are arranged in a manner electrically isolated from one another in each case in the active trenches fabricated between the trench fillings. The sides of the gate electrodes 16 are insulated with the spacer elements 17, e.g. made of nitride. There may also be applied on the gate electrodes 16 a strip-type layer 19 made of polysilicon, tungsten or tungsten silicide and a hard mask layer 20 for the patterning of the gate electrodes.

Figure 6:
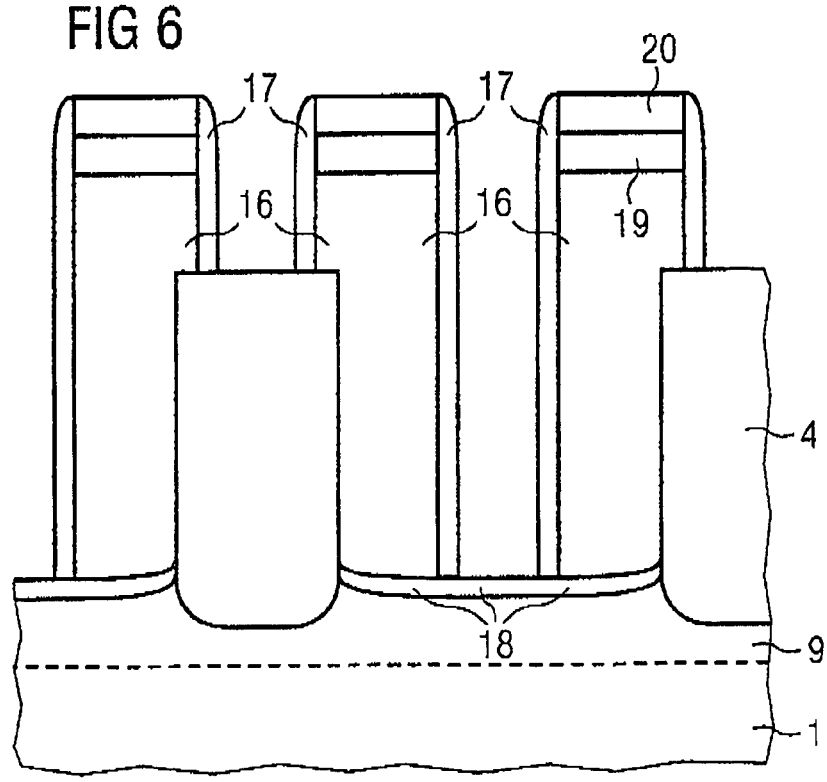

A cross-section through the memory cell array in the position of the section B depicted in FIG. 9 is illustrated in FIG. 6 for this intermediate product. It can be seen there that the material of the gate electrodes 16 is also present in the region between the individual memory cells in the longitudinal direction of the trenches and is patterned identically there. The gate electrodes 16 patterned in strip form thus form the word lines, which connect together a respective strip of memory cells arranged along a trench filling. The electrically conductive layer 5 is absent in the regions between the individual memory cells. Between the individual memory cells, the portions made of semiconductor material are absent at the sidewalls of the regions made of dielectric material 4. The source-drain regions and channel regions of the individual cells are thus interrupted in the longitudinal direction of the word lines and delimited to the individual cells in this way.

In accordance with the cross-section illustrated in FIG. 7, further method steps also follow, but these are known per se from semiconductor technology. Firstly, a first passivation (preferably a nitride) is deposited and the remaining openings are filled with an insulation layer 21 (preferably BPSG [borophosphosilicate glass]). These method steps also include opening at least partly self-aligned contact holes in connection with the bit lines 22 to be fabricated. A suitable material for the bit lines is, e.g., tungsten. The bit lines 22 are applied on the electrically conductive layers 5 and contact-connected, so that an electrically conductive connection to the upper source-drain regions 10 is fabricated here. However, it is also possible to use polysilicon-filled contact holes in connection with aluminum interconnects or to use a copper-based metallization scheme, likewise known per se.

FIG. 8 illustrates in cross-section an alternative exemplary embodiment, in which the dielectric layer 18 provided for the gate dielectric is removed in the region between the gate electrodes 16. Thus, interfaces 24 of the lower source-drain regions 9, which are continuous here as ground plate, are in each case uncovered there. Contact hole fillings 23, 25 for the electrically conductive layers 5 and the uncovered interfaces 24 of the lower source-drain regions 9, respectively, are introduced into the corresponding openings above them. An appropriate material for the contact hole fillings is, e.g., polysilicon. This material is leveled at the top side and patterned as required using a suitable photomask technique. The bit lines are then fabricated in a manner running transversely with respect to the word lines (not depicted in FIG. 8). The bit lines are applied in an electrically insulated manner with respect to the contact hole fillings 25 of the ground plate and are patterned in strip form in such a way that the electrically conductive layers 5 of the cells are connected. Between the bit lines and parallel thereto it is possible to produce a principle arbitrary number of similar conductor strips with contact on the relevant contact hole fillings 25 for the connection of the ground plate.

Although the present invention and its advantages have been described in detail, it should be understood that various changes, substitutions and alterations can be made herein without departing from the spirit and scope of the invention as defined by the appended claims.

What is claimed is:

1. A capacitorless 1-transistor DRAM cell comprising:
   doped source-drain regions disposed in semiconductor material;
   a channel region disposed in the semiconductor material between doped source-drain regions, wherein the source-drain regions are embedded in a dielectric material in such a way that the channel region is at least partially depleted of charge carriers in the absence of an applied electrical potential; and
   a gate electrode arranged alongside the channel region, the gate electrode being insulated from the channel region by a gate dielectric;
   wherein:
   a region made of the dielectric material is formed at a top side of a semiconductor body;
   the channel region is arranged at a sidewall of the region made of the dielectric material;
   the source-drain regions adjoin the channel region on both sides in the vertical direction with regard to the top side;
   the gate electrode is arranged alongside of the channel region that is remote from the region made of the dielectric material and in a manner isolated from said channel region by the gate dielectric;
   the gate electrode is electrically coupled to a word line; and
   an upper one of the source-drain regions is electrically coupled to a bit line.

2. The DRAM cell as claimed in claim 1, wherein the semiconductor material of the channel region is bounded by the dielectric material toward all sides in a sectional plane that is co-planar with respect to the top side.

3. The DRAM cell as claimed in claim 2, wherein the semiconductor material of the channel region has dimensions which are smaller in the vicinity of the gate electrode than in the vicinity of the region made of the dielectric material in directions which run parallel to a boundary between the semiconductor material of the channel region and the region made of the dielectric material in a sectional plane that is co-planar with respect to the top side.

4. An arrangement comprising a plurality of 1-transistor DRAM cells as claimed in claim 1, wherein:
   a plurality of regions made of dielectric material that are arranged at a distance from one another are present at the top side of the semiconductor body;
   between the regions made of dielectric material, the semiconductor material is in each case removed except for portions which are present at the sidewalls of the regions made of the dielectric material and are provided for channel regions and source-drain regions, so that a cutout is in each case present between said remaining portions of the semiconductor material; and
   gate electrodes are arranged in said cutouts.

5. The arrangement as claimed in claim 4, wherein:
   electrically conductive layers are present at the top side above the regions made of the dielectric material; and
   said electrically conductive layers in each case connect together two upper source-drain regions with regard to the semiconductor body which are present at mutually opposite sidewalls of the relevant region made of the dielectric material.

6. The arrangement as claimed in claim 4, wherein a lower one of the source-drain regions with regard to the semiconductor body is formed as a continuous doped region in the manner of a ground plate.

* * * * *